United States Patent
Rinner et al.

(10) Patent No.: US 10,361,018 B2
(45) Date of Patent: Jul. 23, 2019

(54) METHOD FOR PRODUCING A MULTI-LAYER COMPONENT AND MULTI-LAYER COMPONENT

(71) Applicant: EPCOS AG, Munich (DE)

(72) Inventors: Franz Rinner, Deutschlandsberg (AT); Dieter Somitsch, Gross St. Florian (AT); Christoph Auer, Graz (AT); Gerhard Fuchs, Steinerkirchen (AT)

(73) Assignee: EPCOS AG, Munich (DE)

( * ) Notice: Subject to any disclaimer, the term of this patent is extended or adjusted under 35 U.S.C. 154(b) by 734 days.

(21) Appl. No.: 14/407,919

(22) PCT Filed: Jun. 6, 2013

(86) PCT No.: PCT/EP2013/061724
§ 371 (c)(1),
(2) Date: Dec. 12, 2014

(87) PCT Pub. No.: WO2013/186121
PCT Pub. Date: Dec. 19, 2013

(65) Prior Publication Data
US 2015/0123516 A1    May 7, 2015

(30) Foreign Application Priority Data

Jun. 12, 2012   (DE) .......................... 10 2012 105 059

(51) Int. Cl.
*H01C 7/00*   (2006.01)
*H01G 4/30*   (2006.01)
(Continued)

(52) U.S. Cl.
CPC .............. *H01C 7/008* (2013.01); *C25F 3/00* (2013.01); *H01C 1/14* (2013.01); *H01C 7/10* (2013.01);
(Continued)

(58) Field of Classification Search
CPC .......... Y10T 29/42; H01C 7/008; H01C 1/14; H01G 4/005; C25F 3/00; H01L 41/0471; H05K 3/06; H05K 3/08
See application file for complete search history.

(56) References Cited

U.S. PATENT DOCUMENTS 3,487,522 A * 1/1970 Harendza-Harinxma ................... C23F 1/02
257/533
3,849,874 A * 11/1974 Jeffers ................... G01L 1/2293
29/25.35
(Continued)

FOREIGN PATENT DOCUMENTS

CN   201279814 Y   7/2009
DE   4224284 A1    1/1993
(Continued)

OTHER PUBLICATIONS

Beschleunigungssensor—<http://de/wikipedia.org/wiki/Beschleunigungssensor> (English article: Accelerometer—<http://en.wikipedia.org/w/index.php?title=Accelerometer&printable=yes>).
(Continued)

*Primary Examiner* — Peter Dungbo Vo
*Assistant Examiner* — Jeffrey T Carley
(74) *Attorney, Agent, or Firm* — Morgan, Lewis & Bockius LLP

(57) ABSTRACT

A method for producing a multilayer component (21) is specified, which involves providing a body having dielectric layers (3) arranged one above another and first and second electrically conductive layers (4, 84, 5, 85) arranged therebetween. The first conductive layers (4, 84) are connected to a first auxiliary electrode (6) and the second conductive layers (5, 85) are connected to a second auxiliary electrode (7). The body (1, 81) is introduced into a medium and a
(Continued)

Figure 1:
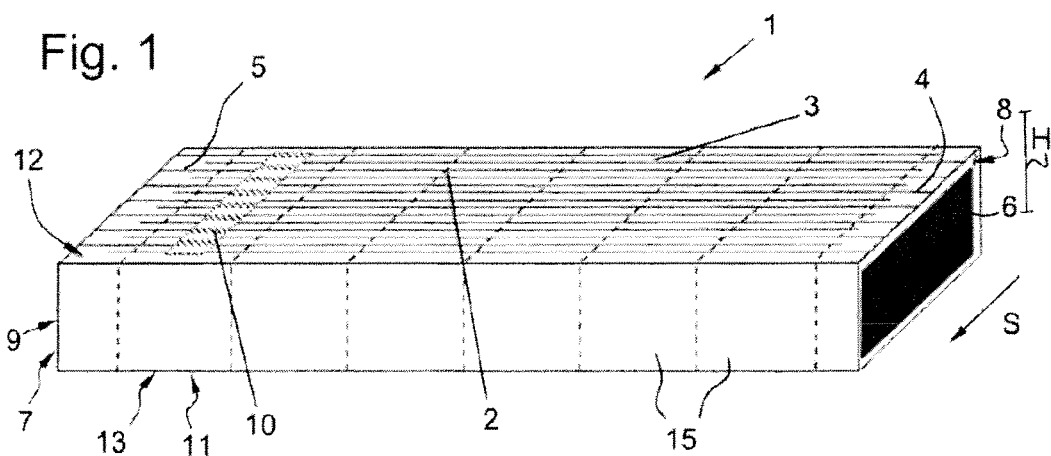

voltage is applied between the first and second auxiliary electrodes (6, 7) for producing a material removal. Furthermore, a multilayer component is specified, which has depressions (20) formed by an electrochemically controlled material removal.

14 Claims, 6 Drawing Sheets

(51) Int. Cl.
*H01C 1/14* (2006.01)
*H01C 7/18* (2006.01)
*H01C 17/00* (2006.01)
*H01C 17/28* (2006.01)
*H01G 4/012* (2006.01)
*H01L 41/083* (2006.01)
*H01L 41/297* (2013.01)
*C25F 3/00* (2006.01)
*H01C 7/10* (2006.01)
*H01G 4/005* (2006.01)
*H01L 41/047* (2006.01)

(52) U.S. Cl.
CPC .............. *H01C 7/18* (2013.01); *H01C 17/006* (2013.01); *H01C 17/28* (2013.01); *H01G 4/005* (2013.01); *H01G 4/012* (2013.01); *H01G 4/30* (2013.01); *H01L 41/0471* (2013.01); *H01L 41/0838* (2013.01); *H01L 41/297* (2013.01)

(56) References Cited

U.S. PATENT DOCUMENTS

| | | | | | |
|---|---|---|---|---|---|
| 3,934,985 | A | * | 1/1976 | Kitaev | H05K 3/424 428/598 |
| 5,144,527 | A | * | 9/1992 | Amano | H01G 4/012 29/25.42 |
| 5,597,494 | A | * | 1/1997 | Kohno | H01G 4/30 216/13 |
| 6,283,371 | B1 | | 9/2001 | Son | |
| 6,444,304 | B1 | * | 9/2002 | Hisamoto | C23C 28/00 428/212 |
| 7,905,000 | B2 | * | 3/2011 | Ganster | H01L 41/273 29/25.35 |
| 2007/0200109 | A1 | * | 8/2007 | Sciortino | H01L 41/273 257/17 |
| 2009/0320255 | A1 | * | 12/2009 | Ganster | H01L 41/273 29/25.35 |
| 2010/0320876 | A1 | * | 12/2010 | Dernovsek | H01L 41/0477 310/364 |
| 2011/0197409 | A1 | * | 8/2011 | Kim | H05K 1/162 29/25.42 |
| 2012/0019107 | A1 | * | 1/2012 | Gabl | H01L 41/0472 310/363 |

FOREIGN PATENT DOCUMENTS

| | | |
|---|---|---|
| DE | 4410504 A1 | 9/1994 |
| DE | 10345500 A1 | 4/2005 |
| DE | 102006001656 A1 | 2/2007 |
| DE | 102007004813 A1 | 8/2008 |
| JP | H0382004 A | 4/1991 |
| JP | H0566951 U | 9/1993 |
| JP | 2004303922 A | 10/2004 |
| JP | 2005108989 A | 4/2005 |
| JP | 2010517311 A | 5/2010 |
| JP | 2015516562 A | 6/2015 |
| WO | 2011/099381 A1 | 8/2011 |

OTHER PUBLICATIONS

Natriumpersulfat—<http://de/wikipedia.org/wiki/>Natriumpersulfat (English article: Sodium persulfate—<http://en.wikipedia.org/w/index.php?title=Sodium_persulfate&printable=yes>).

* cited by examiner

METHOD FOR PRODUCING A MULTI-LAYER COMPONENT AND MULTI-LAYER COMPONENT

A method for producing a multilayer component and a multilayer component are specified. The multilayer component can be embodied as a piezoactuator which is used, for example, for actuating an injection valve in a motor vehicle. The multilayer component can also be embodied as a varistor, capacitor, NTC thermistor or PTC thermistor.

The documents DE 10 2006 001 656 A1, DE 44 10 504 B4 and DE 10 2007 004 813 A1 describe electrochemical etching methods for forming insulation zones in multilayer components.

One object to be achieved is to specify an improved method for producing a multilayer component and a multilayer component having improved properties.

A method for producing a multilayer component is specified, which involves providing a body having dielectric layers arranged one above another and first and second electrically conductive layers arranged therebetween. Preferably, the body has a multiplicity of first conductive layers and a multiplicity of second conductive layers. However, it is also possible for only one first conductive layer to be present. Furthermore, it is also possible for only one second conductive layer to be present. Hereinafter, the plural is usually used for the first and second conductive layers, but embodiments in which only one first conductive layer or only one second conductive layer is present are also included here.

Preferably, a piezoelectric component is produced by the method; in particular, the multilayer component can be embodied as a piezoactuator. The dielectric layers are for example ceramic layers, in particular piezoceramic layers.

In one embodiment, the first and second conductive layers in the multilayer component serve as electrodes. In particular, the electrodes can be embodied as electrode layers.

Preferably, a voltage is applied between the electrodes during the operation of the component. In this case, by way of example, insulation zones are produced by the method described here. By way of example, the insulation zones serve to insulate the first and second conductive layers alternately from an outer side of the body. Consequently, the first conductive layers can be jointly electrically contact-connected by an external contact-connection arranged on an outer side of the stack, while the second conductive layers are insulated from said external contact-connection. Likewise, the second conductive layers can be jointly electrically connected by a further external contact-connection arranged on a further side of the stack, while the first conductive layers are insulated from this external contact-connection.

Alternatively or additionally, predetermined breaking regions can be formed by the method described here. By way of example, the predetermined breaking regions can simultaneously function as insulation zones.

A predetermined breaking region is preferably a weak point in the component which serves for purposefully producing and guiding cracks. Uncontrolled arising and propagation of cracks in the component can be prevented in this way, thereby reducing the risk of short circuits. The risk of cracks is particularly high if adjacent electrode layers in the component are alternately led as far as one side surface and are spaced apart from the opposite side surface. This gives rise to inactive zones in the component in which mechanical stresses can arise.

In a further embodiment, at least one of the first and second conductive layers in the multilayer component has no function as electrode layer.

Preferably, the first conductive layers in the multilayer component have no function as electrode layer. Preferably, in this case, a predetermined breaking region is formed by the method. In particular, a predetermined breaking region can be formed at the position of a conductive layer which has no function as electrode layer in the multilayer component. In one embodiment, this conductive layer is completely removed during the method.

The first and second conductive layers can be arranged alternately in the stacking direction. However, it is also possible for a plurality of second conductive layers to be arranged between two successive first conductive layers.

Preferably, the first conductive layer is connected to a first auxiliary electrode and the second conductive layer is connected to a second auxiliary electrode.

The auxiliary electrodes are arranged for example on two opposite side surfaces of the body. The auxiliary electrodes are preferably present only temporarily and in particular are no longer present in the later multilayer component.

In one method step, at least one part of the body is introduced into a medium, in particular a liquid. This is preferably an electrolyte. The medium can be an etching medium. By way of example, the first auxiliary electrode is arranged at a first side surface of the body and the second auxiliary electrode is arranged at a second side surface, and at least one third side surface of the body is introduced into the medium.

Preferably, a voltage is applied between the first and second auxiliary electrodes. A material removal from at least one of the first and second electrically conductive layers can be produced in this way. By way of example, the material removal is produced in an electrically controlled manner, in particular by means of an electrochemical etching process. In this case, depressions are preferably formed in the body; in particular, depressions can be formed at the position of the first conductive layer.

By way of example, a material transport between the first and second electrically conductive layers can be controlled by applying a voltage. In this case, by way of example, material, in particular electrically conductive material such as e.g. a metal, can detach from a first conductive layer and deposit on a second electrically conductive layer. This layer can for example be a plurality of μm thick and comprise copper.

In one embodiment, at least one of the electrically conductive layers, in particular a first conductive layer, is etched in an electrically controlled manner. In a further embodiment, the material from one of the electrically conductive layers, in particular from a first conductive layer, can detach electrolytically.

Preferably, material is deposited in an electrically controlled manner on at least one of the electrically conductive layers, in particular a second conductive layer. A coating is preferably produced.

By way of example, material deposition is produced by an electrolytic process. By way of example, the material detached from a first conductive layer migrates to the second electrically conductive layer and accumulates there. A coating of the conductive layer can lead to an improvement in making electrical contact with the layer. In particular, an undesired material removal, e.g. in an etching process, can be compensated for by the material deposited on the conductive layer.

In one embodiment, a third auxiliary electrode can additionally be introduced into the medium. The third auxiliary electrode is preferably not connected to the component, but rather arranged separately from the component. The third auxiliary electrode makes it possible to carry out the material removal and/or the deposition of material in a particularly controlled manner.

The third auxiliary electrode can be put at the same potential as the first or second auxiliary electrode. In this case, the third auxiliary electrode is preferably put at the same potential as the second auxiliary electrode. Alternatively, the third auxiliary electrode can be put at a potential which differs from the potential of the first and second auxiliary electrodes. Preferably, the third auxiliary electrode in this case is put at a potential lying between the potentials of the first and second auxiliary electrodes. Particularly preferably, the first auxiliary electrode is put at a positive potential, the second auxiliary electrode is put at a negative potential and the third auxiliary electrode is put at a more negative potential than the second auxiliary electrode.

In one preferred embodiment, the body is sintered before being introduced into the medium.

In this way, the depressions introduced by the material removal are not altered by later sintering processes, in particular filled with dielectric material. Consequently, the depressions can fulfill their function as predetermined breaking regions particularly well. Furthermore, the geometry of the depression can be defined well in the case of a sintered body. By way of example, very narrow depressions can be produced, such that very narrow insulation zones and predetermined breaking regions are formed. In this way, the active region of the multilayer component, which active region generates the power, is reduced only to a small extent by the insulation zones and predetermined breaking regions.

Preferably, in at least one stage of the process of material removal, a positive potential is applied to the first auxiliary electrode, while a negative potential is applied to the second auxiliary electrode.

Applying a negative potential and a positive potential makes it possible to carry out the material removal and the deposition of material in a particularly controlled manner. In particular, removal of material from a second electrically conductive layer can be prevented by applying a negative potential. This is advantageous, in particular, if the medium used is a strong etching medium which can etch the electrically conductive layers even without a voltage being applied. As a result, by way of example, a metal layer can be deposited at the conductive layers put at negative potential via the auxiliary electrode. This can be advantageous for specific further contact-making concepts.

In one embodiment, the medium, in particular an etching medium, is chosen in such a way that the dielectric layers, in particular ceramic layers, are attacked only slightly or not at all. By way of example, the medium comprises iron(III) chloride, sodium persulfate or copper chloride ($CuCl_2$).

In one embodiment, at least one of the first and second conductive layers contains copper or consists of copper. Preferably, at least the first conductive layer contains copper. Particularly preferably, both the first and the second conductive layers contain copper. Preferably, all electrically conductive layers have the same material composition.

The use of copper in the conductive layer enables simpler material removal, in particular in an etching process. By way of example, copper can be etched with a wide range of mild chemicals. Conductive layers composed of silver or silver-palladium necessitate more aggressive etching media for etching, which in particular can also attack the dielectric layers.

The etching process preferably at least partly removes the copper from the conductive layer. The etching media mentioned above are particularly well suited to etching copper.

In one embodiment, the copper is introduced only partly into the medium. By way of example, the body is introduced into the medium by a side surface.

This makes it possible to carry out a material removal on this side surface in a targeted manner, while no material removal is carried out on a further side surface, in particular an opposite side surface, in this stage.

In one embodiment, the body is introduced completely into the medium. In this case, a material removal can be carried out in all regions in one stage.

In one embodiment, a multi-stage material removal process, in particular a multi-stage etching process, is carried out.

In this case, the body can be introduced into the medium only by a first part, for example a side surface, in a first stage. In a second stage, the body is preferably introduced into the medium by a different part, for example an opposite side surface. This enables a material removal, in particular an etching, in a targeted manner at predefined parts of the body. The plurality of the auxiliary electrodes is preferably interchanged between the stages.

By way of example, in the first stage, a positive potential is applied to the first auxiliary electrode and a negative potential is applied to the second auxiliary electrode. In the second stage, a negative potential is applied to the first auxiliary electrode and a positive potential is applied to the second auxiliary electrode. This makes it possible, by way of example, to remove material from the first conductive layers in a targeted manner in the first stage and material from the second conductive layers in a targeted manner in the second stage.

In one embodiment, a single-stage material removal process, in particular a single-stage etching process, is carried out.

In a single-stage process, material is removed only in one stage. In particular, no interchange of the polarity of the auxiliary electrodes is performed. Preferably, the body is introduced into the medium only once.

The single-stage material removal process is particularly well suited if the first conductive layers perform no function as electrodes in the multilayer components. In this case, in the single-stage process, predetermined breaking regions are preferably formed at the position of the first conductive layers. By way of example, the first conductive layer is completely removed in the material removal process.

In one embodiment, the body comprises third conductive layers, which are connected to the second auxiliary electrode. It is also possible for only one third conductive layer to be present. The third conductive layers have a different geometry than the second conductive layers. By way of example, a second conductive layer covers only part of a dielectric layer, while part of the dielectric layer is uncovered. A third conductive layer likewise covers only part of a dielectric layer, wherein the uncovered part is arranged at a different position than in the case of the second conductive layer.

In one embodiment, the second and third conductive layers in the multilayer component serve as electrodes.

In this case, insulation zones which alternately insulate the second and third conductive layers from outer sides of the body can already be present before the material removal.

Preferably, in this case, rather than insulation zones for the later electrodes, only predetermined breaking regions are formed during the material removal. The first conductive layers serve for example only for forming the later predetermined breaking regions.

By way of example, the first conductive layers are arranged only in regions which are adjacent to side surfaces of the body. In particular, in the case of a dielectric layer to which a first conductive layer is applied, a central region is then free of the first conductive layer.

In this way, the geometry of the introduced depressions can be controlled particularly well. The depression then likewise runs only in the vicinity of the side surface and not into a central region.

In one embodiment of the method, the auxiliary electrodes are removed in a further step. In this case, by way of example, ends of the body at which auxiliary electrodes are arranged are separated from the body.

In one embodiment of the method, in a further step, the body is separated into a plurality of main bodies for multilayer components. Alternatively, however, it can also be provided that only one main body for one multilayer component is formed from the body.

In one embodiment of the method in a further step, at least one external contact-connection for making contact with the multilayer component is applied to a side surface. The external contact-connection is preferably applied after the conclusion of the material removal. The external contact-connection can be applied to the body before decomposition into a plurality of main bodies, or just to the individual main bodies.

Preferably, a first and a second external contact-connection are applied. By way of example, the first external contact-connection is electrically connected to the first conductive layers and the second external contact-connection is electrically connected to the second conductive layers. Alternatively, the first external contact-connection can be connected to the third conductive layers and the second external contact-connection can be connected to the second conductive layers.

Furthermore, a multilayer component is specified, comprising a main body having dielectric layers arranged one above another and electrode layers arranged therebetween. The main body has at least one depression formed by an electrochemically controlled material removal. Preferably, the depression is introduced by etching. Preferably, the main body has a plurality of depressions, in particular depressions arranged at different positions along the stacking direction. The depressions preferably serve as predetermined breaking regions.

The multilayer component can be produced by the method described here and can have all functional and structural features described with regard to the method.

Preferably, the depression is arranged in a plane perpendicular to the stacking direction which is free of conductive material. Preferably, the depression is arranged in a plane in which no electrode layer is arranged. Particularly preferably, the planes in which electrode layers run have no predetermined breaking regions. In this case, it is possible to prevent cracks from running in the planes of electrode layers. The reliability of the component can be increased as a result.

The subjects described here are explained in greater detail below on the basis of schematic exemplary embodiments that are not true to scale.

Figure 2:
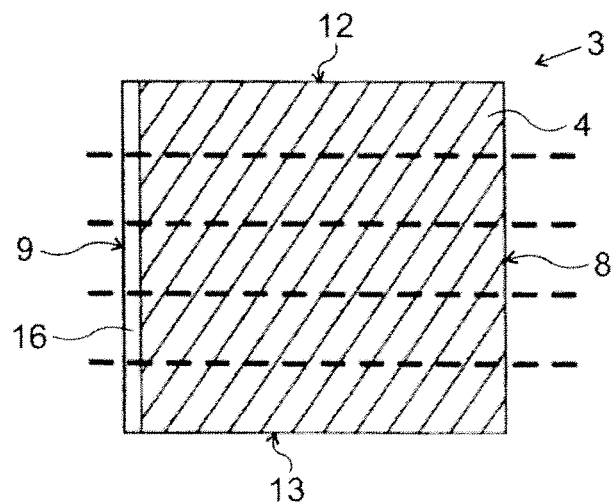
Figure 3:
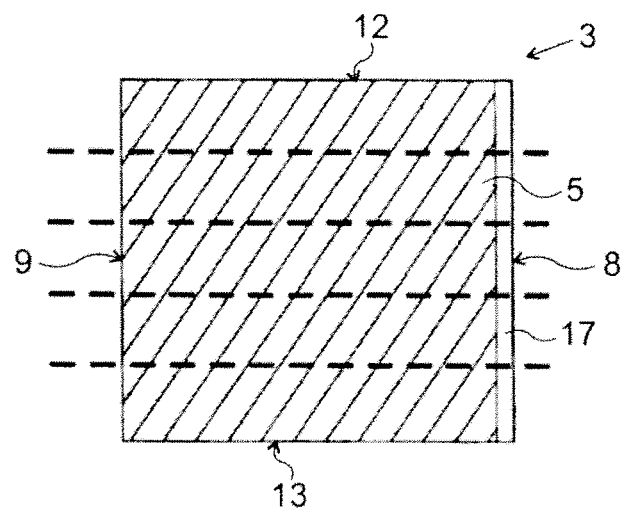
Figure 4:
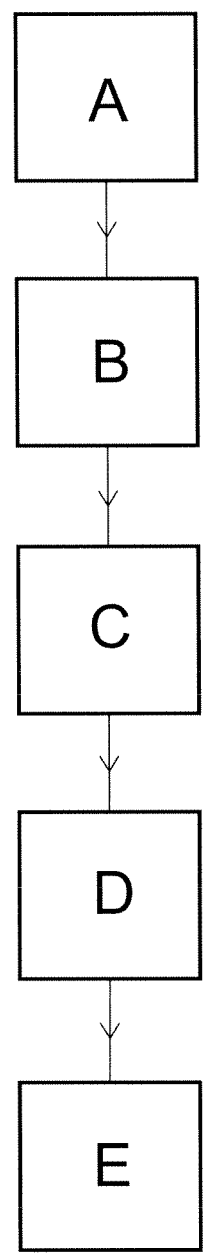
Figure 5:
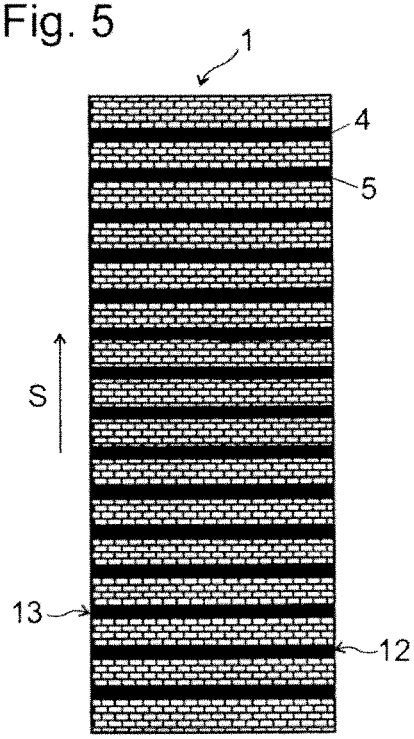
Figure 6:
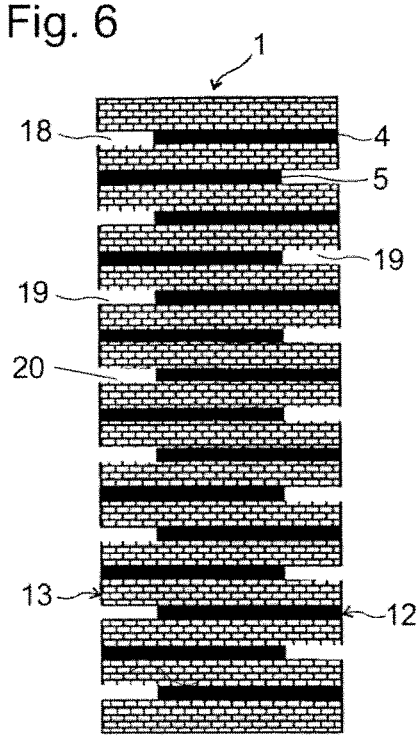
Figure 7:
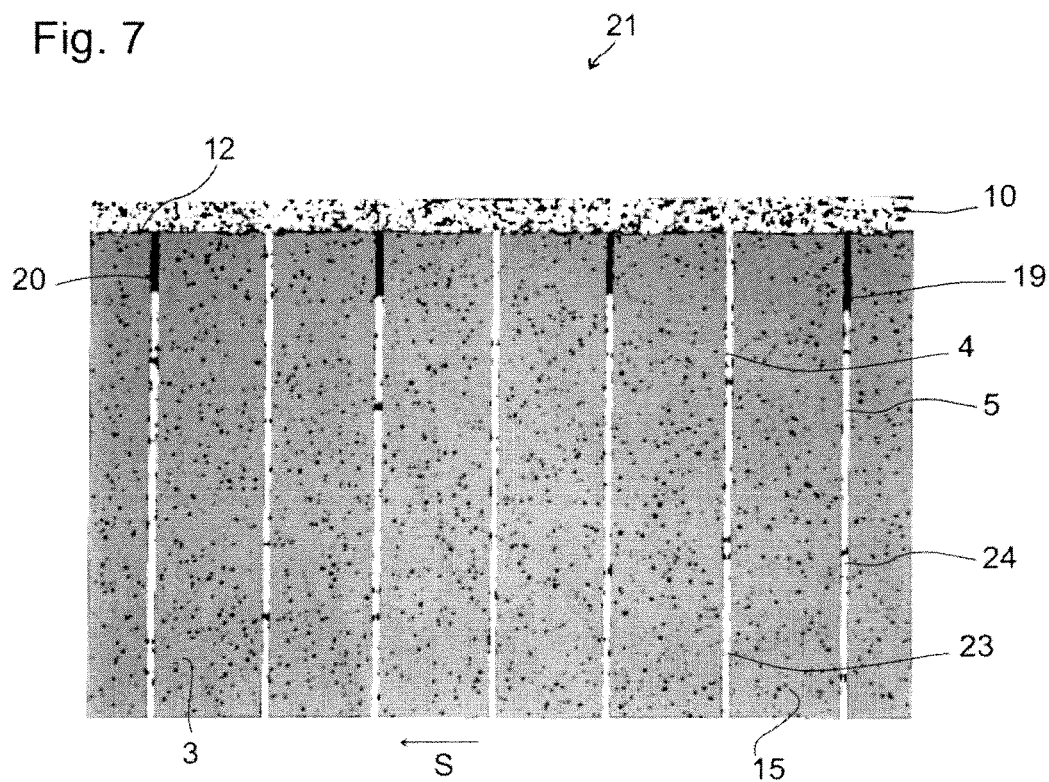
Figure 8:
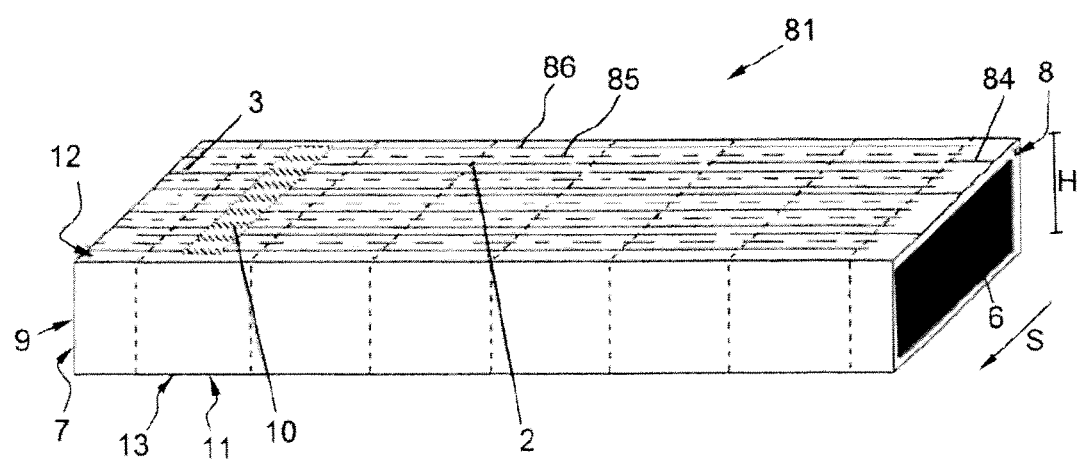
Figure 9:
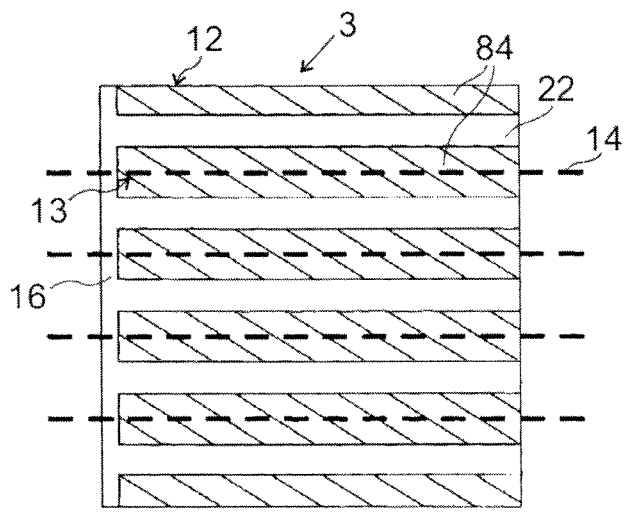
Figure 10:
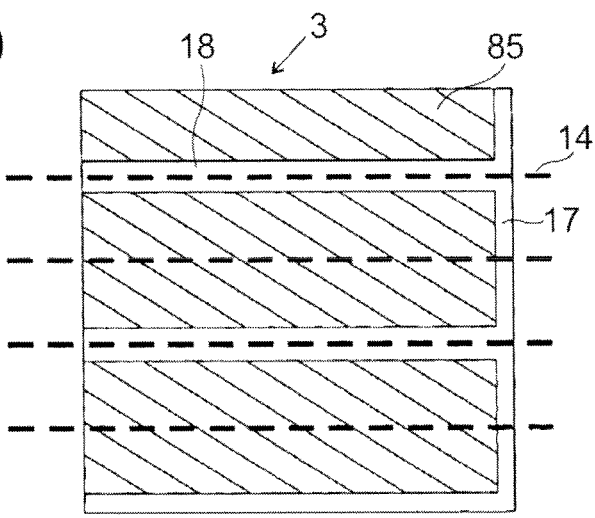
Figure 11:
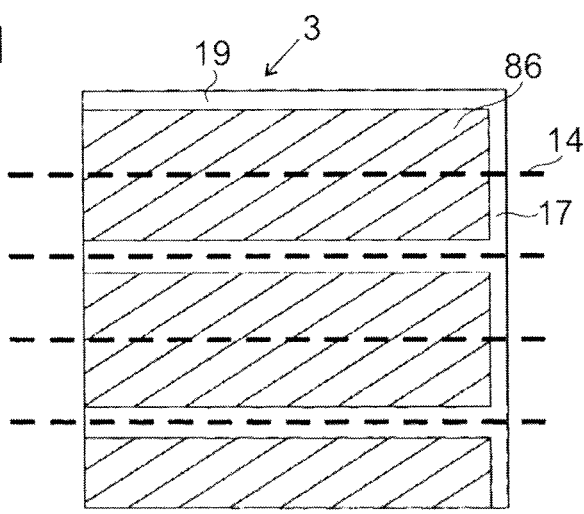
Figure 12:
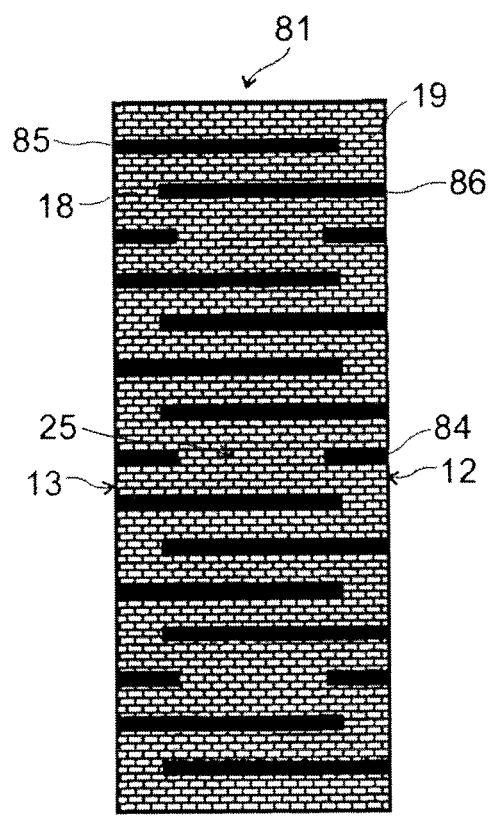
Figure 13:
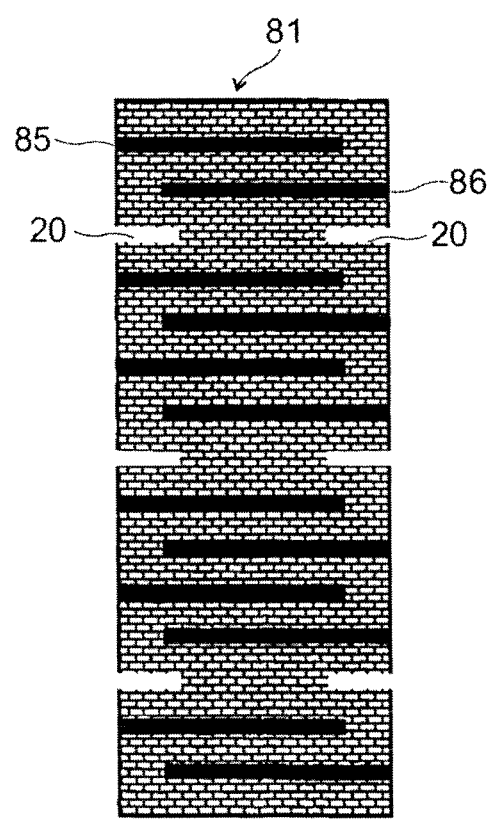

In the figures:

FIG. 1 shows a schematic perspective view of a body for producing multilayer components, FIG. 2 shows a plan view of a dielectric layer having a first conductive layer for a block-shaped body for producing the body from FIG. 1, FIG. 3 shows a plan view of a dielectric layer having a second conductive layer for a block-shaped body for producing the body from FIG. 1, FIG. 4 shows in schematic form the sequence of a method for producing a multilayer component, FIG. 5 shows in cross section the body from FIG. 1 before the material removal, FIG. 6 shows in cross section the body from FIG. 1 after the material removal, FIG. 7 shows in the micrograph a main body of a multilayer component having depressions produced from a body in accordance with FIG. 1, FIG. 8 shows a schematic perspective view of a body in accordance with a further embodiment for producing multilayer components, FIG. 9 shows a plan view of a dielectric layer having a first conductive layer for a block-shaped body for producing the body from FIG. 8, FIG. 10 shows a plan view of a dielectric layer having a second conductive layer for a block-shaped body for producing the body from FIG. 8, FIG. 11 shows a plan view of a further dielectric layer having a third conductive layer for a block-shaped body for producing the body from FIG. 8, FIG. 12 shows in cross section the body from FIG. 8 before the material removal, FIG. 13 shows in cross section the body from FIG. 8 after the material removal.

Preferably, in the following figures, identical reference signs refer to functionally or structurally corresponding parts of the different embodiments.

FIG. 1 shows a schematic perspective view of a body 1 for producing multilayer components.

The body 1 is embodied as a bar and can be separated into a plurality of main bodies 15 for multilayer components along the separating lines 2 depicted. By way of example, the multilayer components are embodied as piezoactuators.

The body 1 and thus also the main bodies 15 formed therefrom later have dielectric layers 3 arranged one above another along a stacking direction S. First and second conductive layers 4, 5 are arranged between the dielectric layers 3. The dielectric layers 3 contain a ceramic material, for example. Preferably, the dielectric layers 3 are embodied as piezoelectric layers; in particular, they can comprise a piezoceramic material.

The body 1 depicted is preferably a sintered body; in particular, the body 1 is already sintered before the material removal described here is carried out. Particularly preferably, the body 1 is a monolithic sintering body, such that the conductive layers 4, 5 are sintered together with the dielectric layers 3. In an alternative exemplary embodiment, the body 1 depicted is present in the green state and is sintered only after the material removal. Hereinafter, the material removal is carried out by means of an electrically controlled etching process. However, other processes, e.g. an electrolytic process, are also appropriate.

The first conductive layers 4 are arranged in a manner alternating with the second conductive layers 5 along the stacking direction S. The first conductive layers 4 extend as far as a first side surface 8, while the second conductive layers 5 are spaced apart from said side surface 8. The second conductive layers 5 extend as far as the second side surface 9, while the first conductive layers 4 are spaced apart from said side surface 9.

The conductive layers 4, 5 preferably contain a metal. Particularly preferably, the conductive layers contain copper or consist of copper. In further embodiments, the conductive layers 4, 5 can contain silver or silver-palladium, for example.

For carrying out the material removal, in particular an etching, two auxiliary electrodes 6, 7 are arranged on the opposite side surfaces 8, 9 of the body 1. The first auxiliary electrode 6 is electrically connected to the first conductive layers 4 and the second auxiliary electrode 7 is electrically connected to the second conductive layers 5. The auxiliary electrodes 6, 7 serve only for carrying out the material removal and are no longer present in the later multilayer component.

In the present exemplary embodiment, the first and second conductive layers 4, 5 in the later multilayer component serve as electrodes between which a voltage is applied during the operation of the multilayer component. For making electrical contact with the electrode layers, in a later method step, a first external contact-connection 10 is arranged on a third side surface 12 and a second external contact-connection 11 is arranged on a fourth side surface 13. The external contact-connections 10, 11 are not yet present before the etching process and are merely indicated here.

In the body 1 shown in FIG. 1, both the first and the second conductive layers 4, 5 extend as far as the third and fourth side surfaces 12, 13. In the etching step described below, insulation zones are formed in order to electrically insulate the first conductive layers 4 from the second external contact-connection 11 and the second conductive layers 5 from the first external contact-connection 10. The insulation zones have a width of 0.1 mm, for example. For this purpose, the first conductive layers 4 and the second conductive layers 5 are partly etched back, such that the first conductive layers 4 are spaced apart from the fourth side surface 13 and the second conductive layers 5 are spaced apart from the third side surface 12.

Furthermore, predetermined breaking regions are formed by the depressions that arise in the etching process, in which predetermined breaking regions cracks arise and are guided in the main body in a targeted manner. It is thereby possible to prevent a crack from forming in the main body in an uncontrolled manner and from leading to short circuits in the event of bridging electrode layers.

A method for producing the body 1 is described below.

A block is formed in which dielectric layers 3 and conductive layers 4, 5 are stacked one above another along the stacking direction S. The block has a greater height H than the body 1. By dividing the block along cutting planes running parallel to the stacking direction S and perpendicular to the extent H, it is possible to produce a plurality of bodies 1.

FIGS. 2 and 3 show plan views of dielectric layers 3 printed with conductive layers 4, 5 in the green state, which are stacked one another alternately for forming a block. Unprinted dielectric layers can also be arranged between the dielectric layers 3 printed with conductive layers 4, 5.

FIG. 2 shows a dielectric layer 3, on which a first conductive layer 4 is applied. The first conductive layer 4 is spaced apart from the second side surface 9 and extends as far as the three remaining side surfaces 8, 12, 13.

FIG. 3 shows a plan view of a further dielectric layer 3, on which a second conductive layer 5 is applied. The second conductive layer 5 is spaced apart from the first side surface 8 and extends as far as the remaining side surfaces 9, 12, 13. Temporary insulation zones 16, 17 are thus formed which serve for insulating the first conductive layers 4 from the second auxiliary electrode 7 and the second conductive layers 5 from the first auxiliary electrode 6.

After the arrangement of the dielectric layers 3 to form a block, the block is pressed and separated into the bar-shaped bodies 1 from FIG. 1 along the separating lines 14 depicted.

Afterward, the bar-shaped body 1 is preferably decarbonized, sintered and possibly ground. Auxiliary electrodes 6, 7 are subsequently applied to the first and second side surfaces 8, 9, said auxiliary electrodes making contact with the electrically conductive layers 4, 5. By way of example, the auxiliary electrodes 6, 7 are embodied as external metallization. For this purpose, it is possible to apply a metallization paste from which the auxiliary electrodes 6, 7 are formed.

FIG. 4 shows in schematic form the sequence of a method for producing a multilayer component. The method is described below with reference to the body 1 from FIG. 1, but is also suitable for differently configured bodies such as, for example, the body 81 depicted in FIG. 8.

A step A involves providing the body 1 having the dielectric layers 3 arranged one above another and first and second electrically conductive layers 4, 5 arranged therebetween. The first conductive layers 4 are connected to the first auxiliary electrode 6 and the second conductive layer 5 are connected to the second auxiliary electrode 7. The body 1 is preferably already sintered in this method step. By way of example, the auxiliary electrodes 6, 7 are applied as metal pastes and sintered together with the dielectric layers 3 and conductive layers 4, 5.

A subsequent step B involves introducing at least one part of the body 1 into a medium, in particular an etching medium.

The etching medium comprises sodium persulfate, for example. By way of example, 150 g of sodium persulfate ($Na_2S_2O_8$) can be dissolved in 1 l of water. Thus, a first copper-containing conductive layer, which is at a positive potential, can be etched in an electrically controlled manner and a second copper-containing conductive layer, which is at a negative potential, can be coated electrolytically.

In this case, the copper from the first conductive layer is detached and depressions are introduced at the location of the conductive layer. At the same time, the copper deposits at the second conductive layer and thus leads to a coating. The copper layer on the second conductive layer can be a plurality of μm thick.

By way of example, the etching step is carried out at an electrical voltage of 1 V to 3 V. By applying a negative potential to the conductive layers that are not to be etched, it is possible to prevent the copper from being removed from this layer as well.

A two-stage etching process is carried out in the case of the body 1 shown in FIG. 1. In this case, in a first etching stage, just one side surface is introduced into the etching medium. By way of example, firstly only the fourth side surface 13 is introduced into the etching medium and a voltage is applied between the auxiliary electrodes 6, 7. A positive potential is applied to the first auxiliary electrode 6 and a negative potential is applied to the second auxiliary electrode 7.

In the first etching stage, the first conductive layers 4, to which the positive potential is applied, are etched back. The second electrically conductive layers 5, which are connected to the negative potential, are not etched in the first stage. Consequently, first insulation zones are introduced into the body 1, which insulate the first conductive layers 4 from the fourth side surface 13.

In a second etching stage, the opposite third side surface 12 is introduced into the etching medium and the polarity of the auxiliary electrodes 6, 7 is interchanged. Consequently, the second conductive layers 5 are etched back and insulation zones are formed.

In an alternative method, the etching is carried out by means of a single-stage process. By way of example, here a body is completely immersed and the polarity of the applied voltage is not interchanged. The single-stage method can be carried out with the body 1 shown in FIG. 8.

After the etching step B, the auxiliary electrodes are removed in a step C. In this case, the ends of the bar-shaped body 1 having the auxiliary electrodes 6, 7 are separated, for example sawn off.

In a method step D, the bar-shaped body 1 is separated, in particular sawn, into the individual main bodies 15. This step D can also be carried out before or simultaneously with step C.

In a subsequent step E, the external contact-connections 10, 11 are applied to the third and fourth side surfaces 12, 13 of the individual main bodies 15. By way of example, a metallization paste is applied for this purpose, and is subsequently fired.

Alternatively, step E can be carried out before step D or before step C. By way of example, the metallization paste is applied to the side surfaces 10, 11 before the body 1 is separated into the individual main bodies 15. By way of example, the metallization can be applied to the side surfaces 12, 13 over the whole area.

FIG. 5 shows in cross section the body 1 from FIG. 1 before the etching step B is carried out. The cross section runs along one of the cutting lines 2 shown in FIG. 1, or parallel thereto. Here the first and second conductive layers 4, 5 extend in each case to both side surfaces 12, 13.

FIG. 6 shows in cross section the body 1 after the etching step B has been carried out. The first conductive layers 4 are etched back on the fourth side surfaces 13 and the second conductive layers 5 are etched back on the third side surfaces 12. Consequently, depressions 20 that alternatively insulate the first and second conductive layers 4, 5 from the opposite side surfaces 12, 13 are now formed in the body 1. The depressions 20 thus form first and second insulation zones 18, 19. Furthermore, the depressions 20 act as weak points in the body 1 which serve for controlled crack production and crack guidance.

FIG. 7 shows a micrograph of a multilayer component 21 produced by the method above and comprising a main body 15. The first electrically conductive layers 4 extend as far as the third side surface 12 and are jointly electrically contact-connected there to the first external contact-connection 10. The second electrically conductive layers 5 are etched back from the third side surface 12 and electrically insulated from the first external contact-connection 10 by second insulation zones 19. First electrodes 23 are formed by the first conductive layers 4 and second electrodes 24 of the multilayer component are formed by the second conductive layers 5. In this case, depressions 20 acting as predetermined breaking regions run in a plane with electrode layers 23, 24.

In an alternative embodiment, the body can have depressions 20 which do not run in a plane of electrode layers 23, 24. Such a body is similar to the body shown in FIG. 7, but comprises additional planes in which depressions 20 and no electrode layers 23, 24 are formed wherein the additional planes are arranged between planes in which electrode layers 23, 24 run.

FIG. 8 shows a schematic perspective view of a body in accordance with a further embodiment for producing multilayer components.

The body 81 is constructed similarly to the body 1 shown in FIG. 1, but differs in the arrangement and configuration of the conductive layers 84, 85, 86. The first conductive layers 84 serve for producing predetermined breaking regions, but not as electrode layers in the later multilayer component. Preferably, the first conductive layers 84 are completely removed in the etching step, such that the multilayer component has depressions instead of the first conductive layers 84. Furthermore, the body 81 has second and third conductive layers 85, 86, which serve as electrode layers for the later multilayer component.

The first conductive layers 84 are electrically connected to the first auxiliary electrode 6. The second and third conductive layers 85, 86 are connected to the opposite second auxiliary electrode 7.

The second conductive layers 85 are spaced apart from the third side surface 12 and extend as far as the fourth side surface 13. The third conductive layers 86 are spaced apart from the fourth side surface 13 and extend as far as the third side surface 12. Consequently, insulation zones that enable the later electrode layers to be alternately insulated from the external contact-connections 10, 11 are already provided before the etching step.

The first conductive layers 84 are arranged only in the vicinity of the third and fourth side surfaces 12, 13, but do not run as far as a central region of the body 81. A central region comprises the region situated at half the height H of the body 81. Consequently, the first conductive layers 84 are embodied as strip-shaped layers running along the side surfaces 12, 13.

FIGS. 9, 10 and 11 reveal, analogously to FIGS. 2 and 3, plan views of green dielectric layers 3, i.e. green sheets. First, second and third electrically conductive layers 84, 85, 86 are applied on the green sheets. The green sheets are stacked to form a block, which is finally decomposed into bar-shaped bodies 81 in accordance with FIG. 8 along the cutting lines 14. Preferably, green sheets on which second and third conductive layers 85, 86 are applied are stacked alternately one above another. Green sheets having the first conductive layers 84 are arranged therebetween at regular intervals, e.g. every 10 green sheets.

FIG. 9 shows a dielectric layer 3, on which a first conductive layer 84 is applied. The first conductive layer 84 is arranged only in the regions which later adjoin the third and fourth side surfaces 12, 13. A central region 22 of the dielectric layer 3 is free of the first conductive layer 84. Consequently, the first conductive layer 84 has two strip-like partial lines. A first temporary insulation zone 16 for insulation from the second auxiliary electrode 7 is furthermore provided.

FIG. 10 depicts a second conductive layer 85. The second conductive layer 85 is spaced apart from the first side surface 8 by a second temporary insulation zone 17, such that insulation from the first auxiliary electrode 6 is produced. A second insulation zone 18 is furthermore provided, which serves for insulation from one of the later external contact-connection.

FIG. 11 depicts a third electrically conductive layer 86. At the same location as in the case of the second conductive layer 85, a second temporary insulation zone 17 is provided, which insulates the third conductive layer 86 from the first auxiliary electrode 6. Furthermore, a second insulation zone 19 is provided in order to insulate this layer 24 from one of the external contact-connections in the multilayer component.

The dielectric layers 3 from FIGS. 9, 10, 11 are stacked one above another, wherein the dielectric layers 3 on which first conductive layers 84 are applied are preferably present in the stack less often than the dielectric layers 3 with the second and third conductive layers 85, 86.

The block is processed further in the manner as described above with regard to FIGS. 2 and 3 and the bar-shaped body 81 from FIG. 8 is formed.

Afterward, the body 81 is processed further in a manner similar to that described with FIG. 4. The first conductive layers 84 are connected to the first auxiliary electrode 6. The second and third conductive layers 85, 86 are connected to the second auxiliary electrode 7.

The etching step B is carried out in a single-stage method. For this purpose, the body 81 is introduced completely into the etching medium. A positive potential is applied to the first auxiliary electrode 6 and a negative potential is applied to the second auxiliary electrode 7. Applying a negative potential is intended to compensate for or prevent etching, in particular purely chemical etching, of the second and third conductive layers 85, 86. In particular, applying a negative potential can lead to a deposition of material on the second and third conductive layers 85, 86. In order to be able to better control the deposition rate, a separate third auxiliary electrode can be introduced into the etching medium.

Consequently, depressions are introduced at the location of the first conductive layers 84, wherein depressions are introduced by etching at both side surfaces 12, 13 here in one etching stage. The first conductive layers 84 can be completely removed in the etching method.

FIG. 12 depicts the body 81 from FIG. 8 before the etching step B in a sectional view along or parallel to the separating lines 2. The first conductive layers 84 are present in the region of the third and fourth side surfaces 12, 13, while the central region 25 is free of said conductive layers 84. The second conductive layers 85 extend as far as the fourth side surface 13 and are spaced apart from the third side surface 12 by second insulation zones 19. The third conductive layers 86 extend as far as the third side surface 12 and are spaced apart from the fourth side surface 13 by first insulation zones 18.

FIG. 13 reveals the body 81 after the etching process. The second and third conductive layers 85, 86 have remained unchanged. The first conductive layers 84 were completely removed in the etching process, such that depressions 20 are now formed at these locations.

From the body 81 shown in FIG. 8, in the method described, multilayer components are produced wherein predetermined breaking regions are arranged in planes in which no electrode layers run. Furthermore, the insulation zones 18, 19 are already formed when the electrically conductive layers 85, 86 are applied to the dielectric layers 3. The insulation zones 18, 19 here have no function as predetermined breaking regions.

LIST OF REFERENCE SIGNS

1 Body
2 Separating lines for separating the bar
3 Dielectric layer
4 First conductive layer
5 Second conductive layer
6 First auxiliary electrode
7 Second auxiliary electrode
8 First side surface
9 Second side surface
10 First external contact-connection
11 Second external contact-connection
12 Third side surface
13 Fourth side surface
14 Separating lines for separating the block
15 Later main bodies
16 First temporary insulation zone
17 Second temporary insulation zone
18 First insulation zone
19 Second insulation zone
20 Depression
21 Multilayer component
22 Central region
23 First electrode
24 Second electrode
81 Body
84 First conductive layer
85 Second conductive layer
86 Third conductive layer
H Height of the bar
S Stacking direction

The invention claimed is:

1. A method for producing a multilayer component comprising the following steps:
   A) providing a body having dielectric layers arranged one above another and first and second electrically conductive layers alternatingly arranged therebetween, wherein the first conductive layers are connected to a first auxiliary electrode and the second conductive layers are connected to a second auxiliary electrode; and
   B) introducing at least one part of the body into a medium and applying a voltage between the first and second auxiliary electrodes in order to produce a material removal from at least one of the first and second electrically conductive layers,
   wherein the material removal is a single-stage etching process,
   wherein in the single-stage etching process, depressions are introduced at two side surfaces of the body, and
   wherein the first conductive layers are completely removed in the single-stage etching process.

2. The method according to claim 1, wherein applying the voltage effects a material transport between the first and second electrically conductive layers.

3. The method according to claim 1, wherein at least one of the electrically conductive layers is etched in an electrically controlled manner or coated in an electrically controlled manner by applying a voltage.

4. The method according to claim 1, wherein in step B) a third auxiliary electrode is introduced into the medium.

5. The method according to claim 1, wherein the body is sintered before being introduced into the medium.

6. The method according to claim 1, wherein at least the first conductive layer contains copper.

7. The method according to claim 1, wherein the medium comprises iron (III) chloride, sodium persulfate or copper chloride.

8. The method according to claim 1, wherein, in at least one stage of the material removal, a positive potential is applied to the first auxiliary electrode and a negative potential is applied to the second auxiliary electrode.

9. The method according to claim 1, wherein the first and second conductive layers in the multilayer component serve as electrodes.

10. The method according to claim 1, wherein the first conductive layers in the multilayer component have no function as electrodes.

11. The method according to claim 1, wherein the body has third conductive layers, which are connected to the second auxiliary electrode, and
   wherein the third conductive layers have a different geometry than the second conductive layers.

12. The method according to claim 11, wherein the second and third conductive layers in the multilayer component serve as electrodes.

13. The method according to claim 1, comprising the following further step:
   C) removing the auxiliary electrodes.

14. The method according to claim 1, comprising the following further step:
   D) separating the body into a plurality of main bodies for multilayer components.

* * * * *